United States Patent [19]

Lubachevsky

[11] Patent Number: 4,901,260
[45] Date of Patent: Feb. 13, 1990

[54] BOUNDED LAG DISTRIBUTED DISCRETE EVENT SIMULATION METHOD AND APPARATUS

[75] Inventor: Boris D. Lubachevsky, Bridgewater, N.J.

[73] Assignee: American Telephone and Telegraph Company AT&T Bell Laboratories, Murray Hill, N.J.

[21] Appl. No.: 114,369

[22] Filed: Oct. 28, 1987

[51] Int. Cl.[4] .............................................. G06F 15/16
[52] U.S. Cl. ...................................... 364/578; 371/23
[58] Field of Search .................. 364/578; 340/286 M, 340/515; 371/23

[56] References Cited

U.S. PATENT DOCUMENTS

| | | | |
|---|---|---|---|
| 4,204,633 | 5/1980 | Goel | 371/23 |
| 4,527,249 | 7/1985 | Van Brunt | 371/23 |
| 4,636,967 | 1/1987 | Bhatt et al. | 364/552 |
| 4,644,487 | 2/1987 | Smith | 364/578 |
| 4,680,784 | 7/1987 | Lehnert et al. | 379/11 |
| 4,751,637 | 6/1988 | Catlin | 364/200 |

OTHER PUBLICATIONS

Abramovici et al., "A Logic Simulation Machine", IEEE Transactions on CAD of IC's & Systems, vol. 2 No. 2 Apr. '83, pp. 82–93.
Howard et al. "Parallel Processing interactively Simulates Complex VSLI Logic", Electronics Dec. 15, 1983, pp. 147–150.
*IEEE Transactions on Software Engineering,* vol. SE-5, No. 5, Sep. 1979, "Distributed Simulation: A Case Study in Design and Verification of Distributed Programs", K. M. Chandy and J. Misra, pp. 440–452.
*Computer Networks,* vol. 3, No. 1, Feb. 1979, "Distributed Simulation of Networks", K. M. Chandy, V. Holmes, and J. Misra, pp. 105–113.
*Communications of the ACM,* vol. 24, No. 11, Apr. 1981, "Asynchronous Distributed Simulation via a Sequence of Parallel Computations", K. M. Chandy and J. Misra, pp. 198–206.
*Proceedings of the Society for Computer Simulation,* (SCS), Distributed Simulation Conference, Jan. 1985, "Fast Concurrent Simulation Using the Time Warp Mechanism", D. Jefferson and H. Sowizral, pp. 63–69.
*Proceedings of the Int. Conf. on Modelling Techniques and Tools for Performance Analysis,* May 16–18, 1984, Paris, "Parallel Time-Driven Simulation of a Network on a Shared Memory MIMD Computer", B. D. Lubachevsky and K. G. Ramakrishnan.

Primary Examiner—Parshotam S. Lall
Assistant Examiner—Christopher L. Makay
Attorney, Agent, or Firm—Henry T. Brendzel

[57] ABSTRACT

A discrete event simulation system that avoids all blocking and advances the simulation time in an efficient manner by treating the simulated system as a set of subsystems and simulating the subsystems concurrently. The simulation proceeds iteratively by restricting the simulation of scheduled events for each subsystem at any one time to a chosen simulated time segment (bounded lag) beginning with the lowest simulation time found among the subsystems. With each simulation iteration, an "at risk", demarcation time is evaluated based only on a subset of the subsystems that can potentially affect the simulation at the considered subsystem. Events scheduled for a time earlier than the "at risk" time are simulated. In simulating systems where some subsystems affect other subsystems only through intermediate subsystems, opaque periods can be experienced when, because of the specific process that is being simulated, such an intermediate subsystem "promises" that a particular route emanating from this subsystem would be busy for a set period of time, and thereby also "promises" that no other subsystem can use this route as a conduit to affect other subsystems. That tends to push forward the "at risk" demarcation time.

24 Claims, 3 Drawing Sheets

BOUNDED LAG DISTRIBUTED DISCRETE EVENT SIMULATION METHOD AND APPARATUS

BACKGROUND OF THE INVENTION

This invention relates to the simulation art, and more particularly to the art of distributed discrete event simulation.

Computer simulation has become very important in recent years because of the many applications where simulation of systems is highly beneficial. One such applicaton is the use of simulation in the design of complex systems. These may be electronic systems such as a telecommunicatons switching network, robot based flexible manufacturing systems, process control systems, health care delivery systems, transportation systems, and the like. Design verification through simulation plays an improtant role in speeding up the design and insuring that it conforms to the specification. Another application is the use of simulation in analyzing, and tracking down, faults appearing in operating system. Still another application is optimizing the operation of existing systems through repeated simulations, e.g., the operation of a manufacturing facility, the operation of the telecommunications network, scheduling and dispatching, etc. Yet another application is the use of simulation to predict the operation of systems which for various reasons can not be tested (e.g., resonse to catastrophe).

Simulations can be classified into three types: continuous time, discrete time, and discrete event. Discrete event simulation means simulation of a system in which phenomena of interest change value or state at discrete moments of time, and no changes occur except in response to an applied stimulus. For example, a bus traveling a prescribed route defines a discrete event system in which the number of passengers can change only when the bus arrives at a bus stop along the route.

Of the three simulation classes, from computation standpoint it appears that discrete event simulation is potentially the least burdensome approach because simulation of time when nothing happens is dispensed with. Of course, synchronizaton of the event simulations must be considered when parellelism is employed. Most often, a discrete event simulator progresses by operating on an event list. An event at the top of the list is processed, possibly adding events to the list in the course of processing, and the simulation time is advanced. Thereafter, the processed event at the top of the list is removed. This technique limits the speed of simulation to the rate at which a single processor is able to consider the events one at a time. In a parrellel scheme many processors simultaneously are engaged in the task creating a potential for speeding up the simulation. Although techniques for performing event list manipulation and event simulation in parallel have been suggested, large scale performance improvements are achieved only by eliminating the event list in its traditional form. This is accomplished by distributed simulations.

In a distributed simulation, a number of parallel processors form a simulation multicomputer network, and it is the entire network that is devoted to a simulation task. More specifically, each processor within the network is devoted to a specific portion of the system that is simulated; it maintains its own event list and communicates event occurrences to appropriate neighbor processors. Stated conversely, if one views a simulated system as a network of interacting subsystems, distributed simulation maps each subsystem onto a processor of the multicomputer network.

Although distributed simulation provides parallelism which has the potential for improving the simulation speed, allocation and synchronization of work among the processors is a major concern which may impede the realization of the improvement goals. One well known approach for distributed simulation has been proposed by Chandy and Misra in "Distributed Simulation: A Case Study in Design and Verification of Distributed Programs," IEEE Transactions on Software Engineering, Vol. SE-5, No. 5, September 1979, pp. 440–452, and by Chandy, Holmes and Misra in "Distributed Simulation of Networks," Computer Networks, Vol. 3, No. 1, February 1979 pp. 105–113. In this approach, they recognize that physical systems to be simulated are composed of independent but interacting entities, and that those entities should be mapped onto a topologically equivalent system of logical nodes. Interaction between nodes is accomplished by the exchange of time-stamped messages which include the desired message information and identify the simulation time of the sending node. In accordancewith the Chandy-Holmes-Misra approach, the nodes interact only via messages. There are no global shared variables, each node is activated only in response to a message, each node maintains its own clock, and finally, the time-stamps of the messages generated by each node are non-decreasing (in time). In this arrangement, each of the nodes works independently to process the events assigned to it in the correct simulated order. Thus, independent event can be simulated in parallel, within different nodes, even if they occur at different simulated times.

The time stamping is required, of course, to maintain causality so that in a message-receiving node an event that is scheduled for time T is not simulated when other incoming messages can still arrive with a time-stamp of less than T. Because of this, when a particular node is able to receive input from two sender nodes, it cannot simulate an event with any assurance that it would not be called upon to refrain from simulating the event, until it receives a message from both sender nodes. Waiting to receive a message from all inputs slows the simulation process down substantially and can easily result in a deadlock cycle where each node waits for a previous node, which amounts to the situation of a node waiting for itself.

To remedy the wait problem, artisans have been employing recovery and avoidance techniques. In the recovery technique, proposed by Chandy and Misra, upon detecting a deadlock, the processors in the network exchange messages in order to determine which of the waiting nodes can process their events in spite of the apparent deadlock. This discribed in K. M. Chandy and J. Misra, "Asynchronous Distributed Simulation via a Sequence of Parallel Computations," Communications of the ACM, Vol. 24, No. 4, April 1981, pp. 198–206. In the avoidance technique, on the other hand, certain types of nodes send null messages under specific conditions even when no instructions for other nodes are called for. By this technique, nodes can be advanced more quickly in their simulation time. Jefferson and Sowizral, in "Fast Concurrent Simulation Using the Time Warp Mechanism," Distributed Simulation, 1985, The Society for Computer Simulation Multiconference, San Diego, Calif., suggest a different technique where each node is allowed to advance in its simulation time "at its own risk," but when a message arrives that would have caused some events to not have been simulated, then a "roll-back" is executed to undo the simulation that was done. Roll-back of a node may not be difficult, perhaps, but the fact that the simulated event(s) that need to be rolled back may have caused messages to be sent to other nodes does complicate the task substantially. To achieve the rollback, Jefferson et al. suggest the use of "anti-messages," which are messages that parallel the original messages, except that they cause the performance of some action that "undoes" the original action.

Neither of these techniques is very good because each potentially expands an inordinate amount of computation time in making sure that the overall simulation advances properly. The null message approach expends computing resources in generating, sending, and reading the null message; the recovery approach expends computing resources to detect and recover from a deadlock, and roll-back approach expends computing resources in simulating events and then undoing the work that was previously done.

SUMMARY OF THE INVENTION

Recognizing that in physical systems there is always some delay between the time when one part of the system does something, and time when another part of the system realizes that something was done, a simulation system is realized that avoids all blocking and advances the simulation time in an efficient manner. The efficiency is achieved by each node independently evaluating for itself a time interval that is not "at risk" and simulating all events that are within that evaluated time. A point in time is not "at risk" for a considered node if no other node in the system has a scheduled event that can affect the simulation at the considered node. By also restricting the simulation of scheduled events at any one time to a chosen simulated time segment (bounded lag) beginning with the lowest simulation time found among the nodes, allows the evaluation of the "at risk" time interval to be based on only a subset of the nodes that can potentially affect the simulation at the considered node. This simplification results from the the fact that there are delays between nodes, and that the lower bounds for those delays are fixed and known apriorily.

In simulating systems where some nodes affect other nodes only through intermediate nodes, opaque periods can be experienced when, because of the specific process that is being simulated, such an intermediate node "promises" that a particular route emanating from this node would be busy for a set period of time, and thereby also "promises" that no other node can use this route as a conduit to affect other nodes. That, in effect, increases the propagation delay from the nodes that use the busy intermediate route, which, in turn, increases the allowance for the simulation time within the bounded lag that is not "at risk".

DETAILED DESCRIPTION

As indicated above, one of the major problems with the prior art distributed simulation systems is their failure to realize and take advantage of the fact that a delay is always present between communicating physical subsystems. This invention takes advantage of this inherent delay, as described in detail below.

Figure 1:
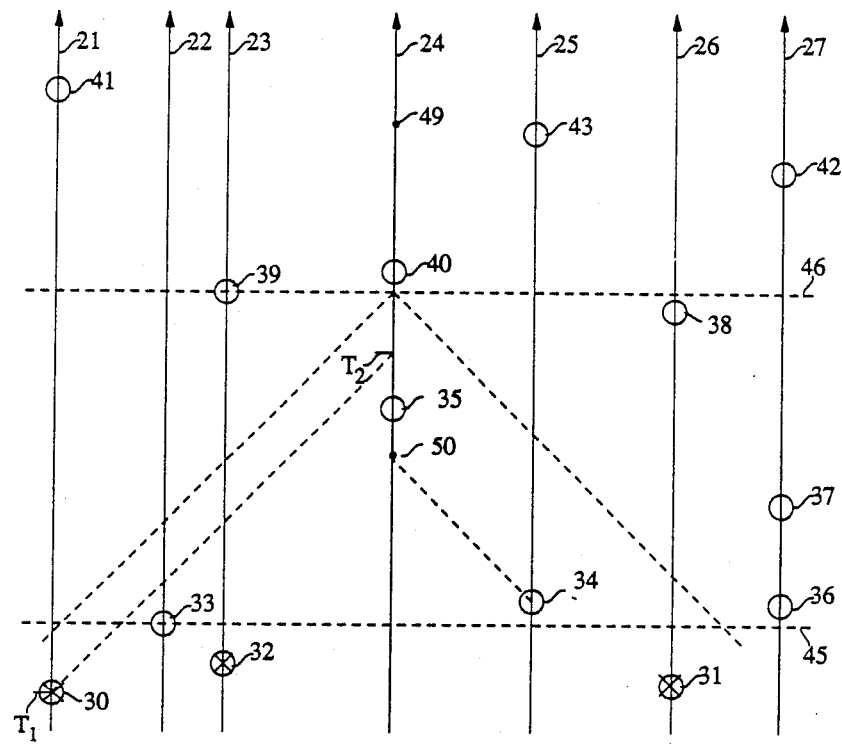
FIG. 1 illustrates the timing inter-relationships of events processed in a multi-processor environment with recognized delay between events and their effect on other events.

FIG. 1 presents a pictorial explanation that may aid in understanding the principles of this invention. Therein, vertical lines 21, 22, 23, 24, 25, 26 and 27 represent seven simulation nodes and their simulation time lines (where time advances upward). The circles along these lines (30–43) represent events that have been, or are scheduled to be processed (i.e., simulated). These events may cause change of value or state, i.e., other events, at the originating node or at some other nodes. For purposes of discussion, it is assumed that node 24 is the node of concern, but it is understood that the consideration undertaken by node 24 are concurrently taken by all other nodes.

The horizontal distances between line 24 and the other lines represent the time delays for events in other nodes to affect the value or state at node 24. Accordingly, event 30 processed at node 21 for time $T_1$ may cause an event 40 at node 24 to be scheduled for some time not earlier than $T_2$, as shown in FIG. 1. The interval between $T_1$ and $T_2$ equals the delay between line 24 and line 21 (i.e., the horizontal distance between the lines).

The events depicted in FIG. 1 can be divided into two groups: those that have been simulated (and marked with a cross), and those that are yet to be simulated (un-crossed). The simulated events need not be considered for simulation because their effects are already represented by those events which have not been simulated (for example, event 30 has caused event 40; the first has been simulated, while the second is yet to be considered for processing).

Of the events that have yet to be simulated (33–43), event 33 in FIG. 1 is earliest in time from among all of the nodes. In this case, the time of event 33, forms the current floor simulation time of the system. The floor is depicted in FIG. 1 by dashed line 45. In accordance with the principles of this invention, a time interval beginning with the floor simulation time is selected for consideration. This time interval, which I call the bounded lag interval, can be a convenient time interval that takes into account the number of nodes in the system, the number of events to be simulated, and the computing power of the processors employed. All events scheduled within the bounded lag interval can be affected by events scheduled at other nodes within the bounded lag time interval, but only if those nodes are at a time distance from the affected node 24 that is less than the selected bounded lag interval. That reduces the number of nodes that need to be considered. In the FIG. 1 depiction, the bounded lag interval ends at dashed line 46; and as drawn, the nodes that need to be considered for their potential effect on node 24 are nodes 22, 23, 25 and 26. Nodes 21 and 27 are outside the bounded lag delay and their scheduled events within (or outside) the bounded lag need not be considered.

In considering the effects on node 24 in greater detail, one can take into account the time of the next scheduled event and reduce the number of nodes being considered even further. In the FIG. 1 embodiment, for instance, the next scheduled event is event 35, and as drawn, only nodes 23 and 25 need to be considered.

In determining whether event 35 is to be simulated, one can observe that only event 34 is scheduled early enough to have a possible impact on event 35. That event can be analyzed and if it is determined that it does not affect event 35, then event 35 can be simulated. Alternatively, it may prove even more efficient to refrain from processing event 35 simply because of the potential effect by event 34. In the following description, this alternative approach is taken because it saves the process of evaluating what event 34 may do.

Figure 2:
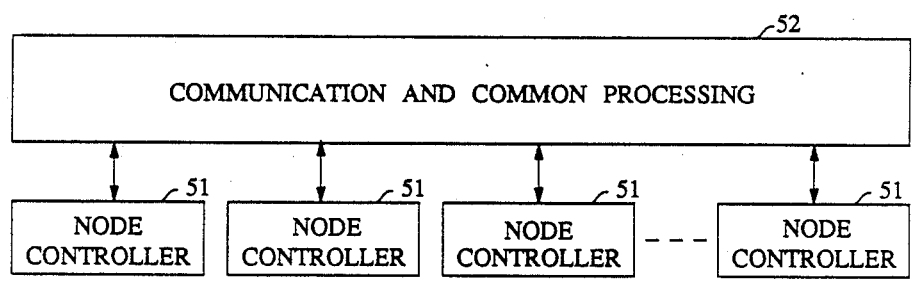
FIG. 2 depicts a block diagram of a multi-processor arrangement for simulating events in accordance with the principles of this invention.

FIG. 2 presents a block diagram of a concurrent event simulator. It comprises a plurality of node controllers 51 that are connected to a communications and common processing network 52. Network 52 performs the communication and synchronization functions, and in some applications it also performs some of the computations that are needed by the entire system. The node controllers can be realized with conventional stored program computers that may or may not be identical to each other. Each of the node controllers, which corresponds to a node in the FIG. 1 depiction, is charged with the responsibility to simulate a preassigned subsystem of the simulated system. Each controller $C_i$ maintains an event list $II_i$ that is executed by simulating each event in the list in strict adherence to the scheduled event simulation times. It should be remembered that the bounded lag interval is selectively fixed, and that in conformance with the selected bounded lag interval each controller 51 is cognizant of the processors with which it must interact to determine whether events are scheduled. The process by which the event simulations are enabled is carried out by the controllers in accordance with the above-described principles, as shown, for example, by the flowchart of FIG. 3.

Figure 3:
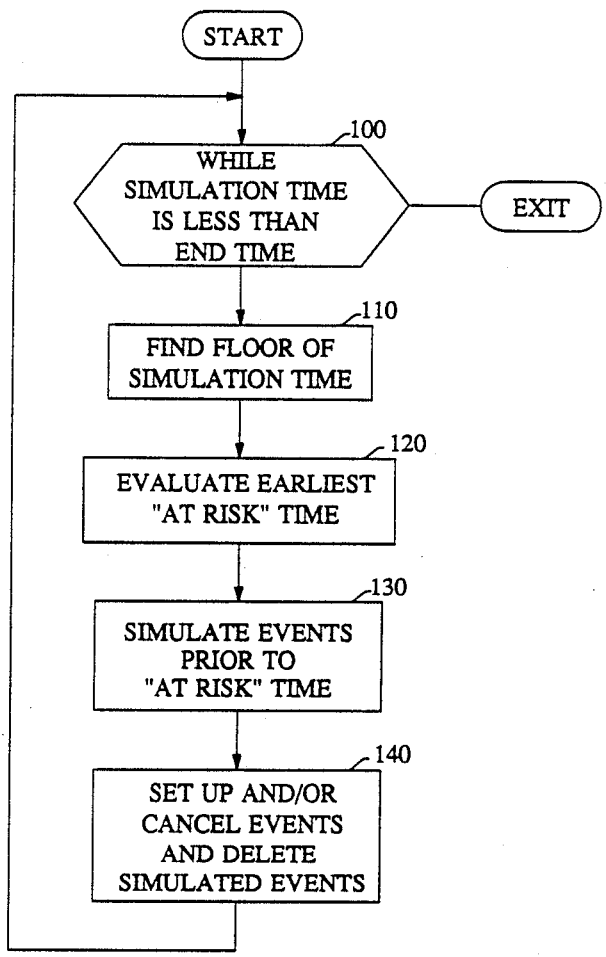
FIG. 3 presents a flow chart describing the steps carried out in each of the processors of FIG. 2 in the course of event simulation.

The process described in FIG. 3 is carried out in iterations that encompass blocks 100 through 140. Block 100 is the flow control block. It tests whether the floor simulation time, $T_{floor}$, *is less than the end of the simulation time*, $T_{end}$. As longs as $T_{floor} < T_{end}$, the simulation continues by passing control to block 110. When $T_{floor}$ reaches or exceeds $T_{end}$, the simulation ends. Block 110 determines the floor simulation time of the simulated system at each iteration. That is, block 110 determines the lowest event time of the scheduled events dispersed among the event lists ($II_i$) of controllers 51 ($C_i$) that are are yet to be simulated. Expressed mathematically, block 110 evaluates the floor simulation time in accordance with the equation $$T_{floor} = \min_{1 \leq i \leq N} T_i,$$

where N is the total number of node controllers 51 and $T_i$ is the time of the event, $e_i$, which has the earliest scheduled time among the events $e'$ in the event list $II_i$; i.e., $$T(e_i) = T_i = \min_{e' \in \pi_i} T(e').$$

Block 110 can be implemented in each of the controllers by having each controller broadcast to all other controllers (via network 52) its $T_i$ and evaluate for itself the minimum $T_i$ which defines $T_{floor}$. Alternatively, block 110 can be implemented within communications and common processing network 52 by having controllers 51 send their $T_i$ values to network 52, and having network 52 select the minimum $T_i$ and broadcast it as $T_{floor}$ back to the controllers.

Having established the $T_{floor}$, and knowing the system's bounded lag interval, B, that limits the number of neighboring controllers with which a controller must communicate, in accordance with block 120, each of the controllers evaluates its earliest "at risk" time. This is accomplished by network 52 distributing the $T_i$ information to neighboring controllers, as required, and each controller $C_i$ evaluates the "at risk" demarcation point, $a_i$, from the $T_i$ information. This "at risk" point is defined as the earliest time at which changes at the neighboring controllers can affect the history simulated by the controller, based on the neighboring controllers' own scheduled events or based on a response to an event from the controller itself (reflection). This is expressed by the following equation:

$$a_i = \min_j [d(j,i) + \min\{T_j, d(i,j) + T_i\}].$$

Having determined the value of $a_i$ which corresponds to the point in the simulated time beyond which the simulation of events at controller $C_i$ is "at risk", in accordance with block 130, processor $C_i$ simulates all or some of the scheduled events whose times are earlier that $a_i$. In block 140, the time $T_i$ is advanced with each simulation of an event, and the simulated event is deleted from $II_i$. Concurrently, if in the course of simulating an event, new events are called to be scheduled, then those events are sent to network 52 for transmission to the appropriate node controllers. Similarly, if the execution of events is called to be blocked, that information is also sent to network 52, and thereafter to the appropriate node controllers for modification of the event lists.

The following carries out the example depicted in FIG. 1, assuming for the sake of simplifying the drawing that the situation remains static—i.e., none of the depicted events are cancelled and no unshown events are scheduled. After events 30, 31, and 32 have been simulated (denoted by the crossed circles) all of the node controllers communicate their earliest scheduled event times, $T_i$, to network 52 where $T_{floor}$ is evaluated to correspond to dashed line 45. With reference to node 24, the bounded lag defined by the distance between dashed line 45 and dashed line 46 specifies that only nodes 22-26 need to be considered. In the course of that consideration, node 24 determines that scheduled event 34 at node 25 defines an "at risk" demarcation point 50. Since there are no events scheduled for node controller 24 between the time of $T_{floor}$ and point 50, no progress in simulations is made by this controller. Concurrently, node controller 22 simulates event 33 (since it is positioned at $T_{floor}$, and no other event can affect it), and node 25 simulates event 34 since neither node 26 nor node 24 (the closest nodes) have any events scheduled prior to the time of event 34. Node 27 probably also simulates event 36, but this is not certain, since FIG. 1 does not show all of the neighbors of node controller 27.

With events 33, 34, and 36 simulated and deleted from their respective event lists, the next iteration raises $T_{floor}$ to the time of event 37 (and correspondingly raises the horizon or end of the bounded lag interval. This end is equal to $T_{floor}+B$). At this new level of $T_{floor}$ the "at risk" demarcation point for node 24 is at point 49 (dictated by event 39 of node 23), and in accordance with this new "at risk" point, both events 35 and 40 are simulated within node controller 24. This completes the simulation of events scheduled for node 24 which are shown in FIG. 1. Concurrently at node 23, event 39 is simulated, event 37 at node 27 is simulated, but at node 26 event 38 is not simulated because it is beyond the "at risk" point of node 26 caused by the position of event 37 at node 27. The next $T_{floor}$ moves to the time of event 38, and the process continues to simulate additional events.

The above description concentrates on evaluating the "at risk" demarcation point in connection with the direct effects of one node on another. In many physical systems, however, there are many instances where one subsystem affects another subsystem indirectly, i.e., through some other subsystem. This condition gives rise to the possibility that the intermediate node is either busy and unavailable generally, or is somehow sensitized to serve some nodes and not other nodes. Either situation can yield the condition that the delay from one node, A, to another node, C, through an intermediate node, B, is at times much longer than the sum of the of delays A to B and B to C. I call this additional delay an opaque period. Opaque periods have the potential for pushing forward the "at risk" demarcation point and, therefore, it is beneficial to account for this potential in evaluating $\alpha_i$. Such accounting may be achieved by evaluating $\alpha_i$ iteratively as follows.

1: Set $\alpha_i^0 = +\infty$ ; $\beta_i^0 = T_i$ ; $k = 0$

2: synchronize

3: evaluate $\beta_i^{k+1} = \min_{\substack{j \in \text{neighbors}(i) \\ j \neq i}} \{d(j,i) + \beta_j^k\}$ 4: evaluate $\alpha_i^{k+1} = \min\{\alpha_i^k, \beta_i^{k+1}\}$ 5: synchronize 6: evaluate $A =$ $\min_{1 \leq i \leq N} \beta_i^{k+1}$ ; broadcast value of $A$ to all nodes In the above, the term neighbors(i) refers to nodes that communicate directly with node i. The auxiliary variable $\beta_i^k$ represents an estimate of the earliest time when events can affect node i after traversing exactly k links. It can be shown that the iteration test is always met within a relatively low number of steps, depending on the value of the bounded lag interval, B. To account for opaque periods, the evaluation of $\beta$ is augmented to be $\beta_i^{k+1} = \min_{\substack{j \in \text{neighbors}(i) \\ j \neq i}} \{d(j,i) + \max\{\beta_j^k, op_{ji}\}\}$ where $op_{ji}$ is the end of opaque period (when communication unblocks) for node j in the direction of node i.

In some simulations it may turn out that the delays between subsystems are very small and that opaque periods predominate. In such systems the value of each $\alpha_i$ reduces to computing the minimum of the opaque periods relative to block i; to wit:

$\alpha_i = \min_{\substack{j \in \text{neighbors}(i) \\ j \neq i}} op_{ji}$

It may be observed that with each iteration the value of $T_{floor}$ increases because the event determining that value can always be simulated. The movement of $T_{floor}$ is affected, however, by how closely the nodes are separated and the scheduled events. One other observation that can be made is that the above-described procedure is very conservative, in the sense that an assumption is made that whenever an event is scheduled to be simulated at one node controller, it will always have an effect on the neighboring controller (after the appropriate delay). In physical systems, however, there are many situations where one part of a system performs many operations that affect none of its neighbor subsystems, or affect only one or very few of its neighbor subsystems. Knowledge that an event scheduled for simulation will not affect a neighboring node can be put to use to simulate more events concurrently (have fewer node controllers that are idle). This can be accomplished by communicating not only the $T_i$ of the earliest scheduled event in each list, but also the effect that it may have on neighboring node controllers. If fact, each list can broadcast more than just the earliest scheduled event. The design decision that a practitioner must make, of course, is whether fewer iterations but more complex evaluations are economically justifiable.

Figure 4:
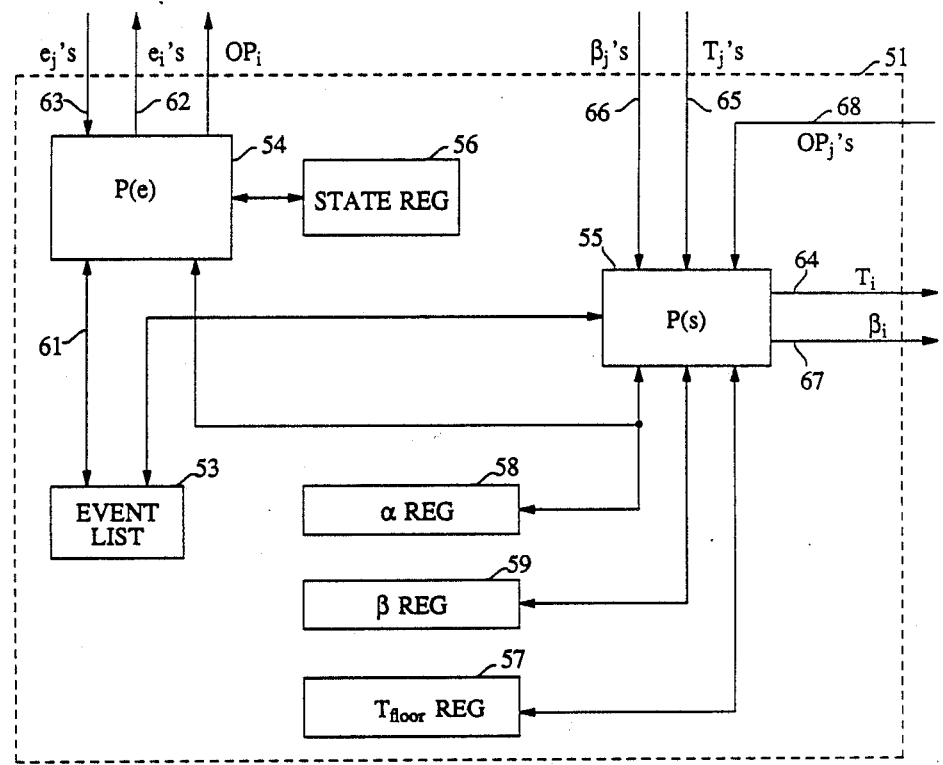
FIG. 4 describes one realization for the node controllers of FIG. 2.

FIG. 4 presents a block diagram of one realization for node controller 51. Although this embodiment relates to use of the iterative method for evaluating $\alpha$ (with the use of the auxiliary variable $\beta$) when the delays between changes in one subsystem and the effect of those changes on other subsystems are not insignificant, it will be appreciated by the skilled artisan that the other realizations for computing $\alpha_i$ are substantially similar to this realization. It will also be appreciated that although node controller 51 is shown in FIG. 2 as one of a plurality of controllers, such plurality can be realized within a single processor of sufficient computing power.

In FIG. 4, state register 56 defines the current state of the simulated subsystem and event list 53 specifies the events that are scheduled to be simulated. Processor 54 is the event simulation processor, and it is responsive to state register 56, to event list 53 and to register 58. Register 58 is the $\alpha$ register and, as the name implies, it stores the value of $\alpha$ for the controller. Based on the value of $\alpha$ and the scheduled time of the event at the top of the event list, processor 54 simulates the event in conformance with the state of the subsystem and develops a new state of the subsystem as well as, perhaps, new events. The new state is stored in register 56, new events scheduled for the controller are stored in event list 53 via line 61, and events affecting other controllers are communicated out via line 62. Events produced at other controllers that may affect this controller are accepted via line 63 and stored in event list 53 through processor 54.

Whereas processor 54 is the event simulation processor, processor 55 is the synchronization processor. Processor 54 is shown in FIG. 4 as a separate processor but in practice a single processor may serve the function of both processor 54 and processor 55. Processor 55 receives information from event list 53 concerning the time of the event in list 53 that possesses the earliest simulation time. It transmits that information to other controllers via line 64 and receives like information from all other relevant nodes via line 65. From that information processor 55 develops the value of $T_{floor}$ and stores that value in register 57. Processor 55 also receives $\beta_i$ information from its neighbor controllers (controllers where changes can affect the controller directly) via line 66, and transmits its own $\beta_i$ values via line 67. With the aid of $T_{floor}$ and the other incoming information, processor 55 performs the iterative computations to develop the values of $\beta_i^k$ and $\alpha_i^k$. Those values are stored by processor 55 in registers 57 and 58, respectively.

It is to be understood that the foregoing descriptions are merely illustrative of my invention and that other implementations and embodiments which incorporate variations from the above may, nevertheless, incorporate the principles thereof. For example, the above assigns the task of computing $T_{floor}$ to processor 55. However, it may be preferable to include computing means in the communication and common processing network of FIG. 2 where the $T_{floor}$ is computed and distributed to the various node controllers.

I claim:

1. A method for simulating behavior of a system containing interacting subsystems, where a known minimum delay exists between changes occurring at one of said subsystems and the effects of said changes on others of said subsystems, said simulating being performed with a simulation system having a plurality of interconnected processors with each of said subsystems to be simulated being simulated on one of said processors, wherein the improvement comprises:

in each of said processors, a step of simulating events of subsystems, to be simulated in each of said processors, whose simulated time lies within a preselected interval following the earliest simulation time of events yet to be simulated by said processors.

2. The method of claim 1 wherein each of said steps of simulating is followed by a step of advancing said earliest simulation time of events yet to be simulated by said processors.

3. The method of claim 1 wherein said step of simulating includes a step of evaluating whether a scheduled event is to be simulated, based on changes occurring at a subset of said subsystems in response to previous simulation steps.

4. The method of claim 3 wherein the subsystems belonging to said subset are dependent on said preselected interval.

5. The method of claim 3 wherein said subset is controlled by said preselected interval and said delays between said subsystems.

6. The method of claim 4 wherein said subset includes the subsystems whose delays are within said preselected interval.

7. The method of claim 3 wherein said step of evaluating computes a simulated time value of $\alpha$ and said step of simulating simulates events whose simulated time is not greater than $\alpha$.

8. The method of claim 7 wherein said $\alpha$ for subsystem i, $\alpha_i$, is computed by $$\alpha_i = \min_j [d(j,i) + \min\{T_j, d(i,j) + T_i\}].$$

where d(j,i) is said delay between changes occurring at subsystem j and their possible effect on system i, d(i,j) is said delay between changes occurring at subsystem i and their possible effect on system j, and $T_j$ is the simulation time of subsystem j event to be simulated having the earliest simulation time from among all other subsystem j events to be simulated.

9. The method of claim 4 wherein said step of evaluating includes consideration of the condition that the effect of a change in one of said subsystems is blocked from propagating through another one of said subsystems.

10. The method of claim 3 wherein said step of evaluating computes a simulated time value of $\alpha$ and said step of simulating simulates events whose simulated time is not greater than $\alpha$, where $\alpha$ for subsystem i, $\alpha_i$, is the value of $\alpha_i^k$ in the final iteration that follows the steps:

1: Set $\alpha_i^0 = +\infty$ ; $\beta_i^0 = T_i$ ; $k = 0$

2: synchronize

3: evaluate $\beta_i^{k+1} = \min_{\substack{j \in \text{neighbors}(i) \\ j \neq i}} \{d(j,i) + \beta_j^k\}$ 4: evaluate $\alpha_i^{k+1} = \min\{\alpha_i^k, \beta_i^{k+1}\}$ 5: synchronize 6: evaluate $A = \min_{1 \leq i \leq N} \beta_i^{k+1}$ ; broadcast value of $A$ to all nodes where $T_i$ is the time of the event in subsystem i having the earliest simulation time, $\beta_i^k$ is an auxiliary variable value at iteration k, and d(j,i) is said delay between changes occurring at subsystem j and their possible effect on subsystem i.

11. The method of claim 3 wherein said step of evaluating computes a simulated time value of $\alpha$ and said step of simulating simulates events whose simulated time is not greater than $\alpha$, where $\alpha$ for subsystem i, $\alpha_i$, is the value of $\alpha_i^k$ in the final iteration that follows the steps:

1: Set $\alpha_i^0 = +\infty$ ; $\beta_i^0 = T_i$ ; $k = 0$

2: synchronize

-continued

3: evaluate $\beta_i^{k+1} = \min\limits_{\substack{j \in \text{neighbors}(i) \\ j \neq i}} \{d(j,i) + \max\{\beta_j^k, op_{ji}\}\}$ 4: evaluate $\alpha_i^{k+1} = \min\{\alpha_i^k, \beta_i^{k+1}\}$ 5: synchronize 6: evaluate $A = \min\limits_{1 \leq i \leq N} \beta_i^{k+1}$ ; broadcast value of $A$ to all nodes where $T_i$ is the time of the event in subsystem i having the earliest simulation time, $\beta_i^k$ is an auxiliary variable value at iteration k, d(j,i) is said delay between changes occurring at subsystem j and their possible effect on subsystem i, and $op_{ji}$ is the opaque period for subsystem j in the direction of subsystem i.

12. The method of claim 4 wherein said step of evaluating computes a value of $\alpha$ and said step of simulating simulates events whose simulated time is not greater than $\alpha$, where $\alpha$ for subsystem i, $\alpha_i$, is equal to $$\min\limits_{\substack{j \in \text{neighbors}(i) \\ j \neq i}} op_{ji},$$

where $op_{ij}$ is the opaque period for subsystem j in the direction of subsystem i.

13. A system for performing discrete event simulation of a system having a plurality of interacting subsystems, comprising:
   a plurality of blocks, each block simulating a preselected subsystem and including an event list associated with said preselected subsystem and means for maintaining information concerning the state of said preselected subsystem, and $\alpha$, where $\alpha$ is an estimate of the earliest simulated time for which modification parameters can be modified by neighboring subsystems, where said modification parameters include the information in said associated state registers and the events in said associated event; and
   a controller system for repetitively performing simulation of events in said event lists and re-evaluating the values of said $\alpha$ and of $T_{floor}$, where $T_{floor}$ is the lowest event time of scheduled events to be simulated by said plurality of blocks.

14. The system of claim 14 wherein said controller system comprises
   a plurality of interconnected controllers communicating with said blocks, with each controller repetitively performing simulation of events in said event lists and re-evaluating the value of said $\alpha$.

15. The system of claim 14 wherein said controller system comprises
   an event evaluation processor associated with each of said blocks, connected to its associated event list, its associated means for maintaining state information, and to neighboring blocks, which are blocks that simulate subsystems that directly affect, or can be affected by, said preselected subsystem, where said event processor performs simulation of events in said associated event list and modifies said associated event list and the event lists of said neighboring blocks, as required by said simulation of events;
   a synchronization processor associated with each of said blocks, connected to its associated event list and means for maintaining $\alpha$, for developing values of said $\alpha$; and
   means for interconnecting said plurality of event evaluation processors and synchronization processors.

16. The system of claim 16 wherein said synchronization processor develops a value of $\alpha$ based on values of $T_j$, from a preselected subset of said subsystems, where $T_j$ is the simulation time of the event in subsystem j having the earliest simulation time.

17. The system of claim 16 where each of said synchronization processors develops a value of $\alpha$ for its block based on a consideration of potential changes in neighbors of its block.

18. The system of claim 17 wherein said consideration is iterative.

19. The system of claim 18 wherein said consideration takes into account opaque periods.

20. The system of claim 16 where each of said synchronization processors develops a value of $\alpha$ for its block based on a consideration of opaque periods of its neighbors.

21. The system of claim 14 wherein said controller system comprises
   a plurality of controllers communicating with said blocks, with each controller repetitively performing simulation of events in said event lists and re-evaluating the value of said $\alpha$; and
   means for interconnecting said controllers.

22. The system of claim 21 wherein said means for interconnecting receives a $T_i$ from each of said event lists, where $T_i$ is the simulated time of the event to be simulated in said event list having the earliest simulation time, develops $T_{floor}$ which is min ($T_i$), and returns $T_{floor}$ to each of said controllers.

23. A system for performing discrete event simulation comprising:
   a plurality of blocks equal in number to the number of simulated interacting subsystems, each block simulating a preselected subsystem and including an event list associated with said preselected subsystem and registers for storing information concerning $T_{floor}$, $\alpha$, $\beta$ and state information of said preselected subsystem;
   means for interconnecting said plurality of blocks;
   an event processing controller associated with each of said blocks, connected to its associated event list, its associated state registers, and to neighboring blocks, which are blocks that simulate subsystems that directly affect, or can be affected by, said preselected subsystem, where said event controller performs simulation of events in said associated event list and modifies said associated event list and the event lists of said neighboring blocks, as required by said simulation of events; and
   a synchronization controller connected to its associated event list, $T_{floor}$, $\alpha$, and $\beta$ registers, and also connected to said means for interconnecting, for developing values for said $T_{floor}$, $\alpha$, and $\beta$ registers, where $T_{floor}$ is the earliest simulated time of an event to be simulated found in any of said event lists, $\alpha$ is an estimate of the earliest simulated time for which the information in said associated state registers or the events in said associated event list can be modified by neighboring subsystems, and $\beta$ is an auxiliary estimate employed in evaluating $\alpha$.

24. A system for performing discrete event simulation comprising:

a plurality of blocks equal in number to the number of simulated interacting subsystems, each block simulating a preselected subsystem and including an event list associated with said preselected subsystem and registers for storing information concerning $T_{floor}$, $\alpha$, and state information of said preselected subsystem;

means for interconnecting said plurality of blocks;

an event processing controller associated with each of said blocks, connected to its associated event list, its associated state registers, and to a subset of said blocks, where said event controller performs simulation of events in said associated event list and modifies said associated event list and the event lists of said neighboring blocks, as required by said simulation of events; and a synchronization controller connected to its associated event list, $T_{floor}$ and, $\alpha$, registers, and also connected to said means for interconnecting, for developing values for said $T_{floor}$, and $\alpha$, registers, where $T_{floor}$ is the earliest simulated time of an event to be simulated found in any of said event lists, and $\alpha$ is an estimate of the earliest simulated time for which the information in said associated state registers or the events in said associated event list can be modified by neighboring subsystems.

* * * * *